United States Patent
Vaculik et al.

(10) Patent No.: US 9,841,446 B1
(45) Date of Patent: Dec. 12, 2017

(54) CONVERSION RATE CONTROL FOR ANALOG TO DIGITAL CONVERSION

(71) Applicant: FREESCALE SEMICONDUCTOR, INC., Austin, TX (US)

(72) Inventors: Lukas Vaculik, Valasske Mezirici (CZ); Jan Tomecek, Roznov pod Radhostem (CZ)

(73) Assignee: NXP USA, Inc., Austin, TX (US)

( * ) Notice: Subject to any disclaimer, the term of this patent is extended or adjusted under 35 U.S.C. 154(b) by 61 days.

(21) Appl. No.: 15/180,814

(22) Filed: Jun. 13, 2016

(51) Int. Cl.
| | |
|---|---|
| *G01R 13/34* | (2006.01) |
| *G01R 13/02* | (2006.01) |
| *G01R 21/133* | (2006.01) |
| *H03M 1/50* | (2006.01) |
| *G01R 19/25* | (2006.01) |
| *H03M 1/12* | (2006.01) |

(52) U.S. Cl.
CPC .......... *G01R 21/133* (2013.01); *G01R 13/34* (2013.01); *G01R 13/345* (2013.01); *G01R 19/2506* (2013.01); *H03M 1/50* (2013.01); *G01R 13/0272* (2013.01); *H03M 1/12* (2013.01)

(58) Field of Classification Search
CPC ...... G01R 21/00; G01R 21/133; G01R 19/00; G01R 19/0053; G01R 19/25; G01R 19/2506; G01R 19/2509; G01R 13/00; G01R 13/02; G01R 13/0218; G01R 13/0272; G01R 13/22; G01R 13/34; G01R 13/345; H03M 1/00; H03M 1/12; H03M 1/50
USPC ......... 324/76.11, 76.12, 76.13, 76.15, 76.38, 324/76.39, 76.41, 76.42, 76.44, 76.47, 324/600, 612, 613, 614
See application file for complete search history.

(56) References Cited

U.S. PATENT DOCUMENTS

| | | | | |
|---|---|---|---|---|
| 4,802,055 A | * | 1/1989 | Beckerman | H02H 9/005 361/111 |
| 5,243,648 A | * | 9/1993 | Gilardi | G06F 21/82 361/111 |
| 5,276,711 A | * | 1/1994 | Rossi | H04L 7/0062 375/348 |
| 6,324,225 B1 | * | 11/2001 | Brianti | G11B 20/10009 375/341 |
| 6,870,429 B2 | * | 3/2005 | Hawley | H04L 27/362 331/16 |

(Continued)

FOREIGN PATENT DOCUMENTS

| | | |
|---|---|---|
| DE | 102007037061 A1 | 2/2009 |
| EP | 0794621 A | 9/1997 |

OTHER PUBLICATIONS

Slosarcik, Ludek, "Using the FFT on Sigma-Delta ADCs," Freescale Semiconductor, Inc., Application Note, Document No. AN4847, Rev. 2, Jul. 2015, 16 pages.

*Primary Examiner* — Hoai-An D Nguyen

(57) ABSTRACT

A method, apparatus, and energy metering system obtains mains samples of a mains power line signal, performs non-white noise (NWN) filtering of the mains power line signal, obtains adjustable clock source samples of an adjustable clock signal of an adjustable clock oscillator, determines a difference based on the mains samples and the adjustable clock source samples, adjusts an adjustable clock source frequency of the adjustable clock oscillator based on the difference, and applies the adjustable clock source frequency to an analog to digital converter (ADC) to determine a conversion rate of the ADC.

20 Claims, 5 Drawing Sheets

(56) References Cited

U.S. PATENT DOCUMENTS

| | | | |
|---|---|---|---|
| 2005/0250466 A1* | 11/2005 | Varma | H04B 1/1027 455/296 |
| 2008/0262732 A1* | 10/2008 | Davis | G01W 1/16 702/4 |
| 2015/0003560 A1* | 1/2015 | Flanagan | H04L 7/0091 375/296 |
| 2016/0025836 A1* | 1/2016 | Derom | G01S 3/808 367/107 |

* cited by examiner

CONVERSION RATE CONTROL FOR ANALOG TO DIGITAL CONVERSION

BACKGROUND

Field of the Disclosure

The present disclosure relates to analog to digital conversion technology and, more specifically, to control of a conversion rate for analog to digital conversion.

Background of the Disclosure

Analog to digital conversion is useful for obtaining a digital representation of an analog signal. The digital representation comprises discrete time samples. Analog to digital conversion can provide the discrete time samples that correspond to a continuous time analog signal at respective points in time. The discrete time samples can be provided at intervals according to a conversion rate of the analog to digital converter (ADC) providing the discrete time samples. Difficulties can arise when a periodic nature of the analog signal being sampled is not stable but changes over time relative to the conversion rate. It is possible to post-process the samples according to a software re-sampling method (e.g., interpolation) to compensate for such changes of the periodic nature of the analog signal, where the needed number of samples are recalculated from actual samples. However, such post-processing is computationally intensive and can result in an unacceptably high core load of the processor core performing the post-processing.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A mains power line is an alternating current (AC) power source typically provided to customers from an electric utility. A method, apparatus, and energy metering system obtains samples, referred to as mains samples, of a mains power line signal, performs non-white noise (NWN) filtering of the mains power line signal, obtains samples, referred to as adjustable clock source samples, of an adjustable clock signal of an adjustable clock oscillator, determines a difference based on the mains samples and the adjustable clock source samples, adjusts an adjustable clock source frequency of the adjustable clock oscillator based on the difference, and applies the adjustable clock source frequency to an analog to digital converter (ADC) to set a conversion rate of the ADC. The NWN filtering removes noise that does not conform to a Gaussian (e.g., white) noise statistical distribution, for example, noise that bears a relationship to a fundamental frequency of a mains power line waveform. A NWN filtered mains power line signal is used to adjust the adjustable clock oscillator to allow the conversion rate of the ADC to track changes in a mains frequency of the mains power line waveform over time.

Figure 1:
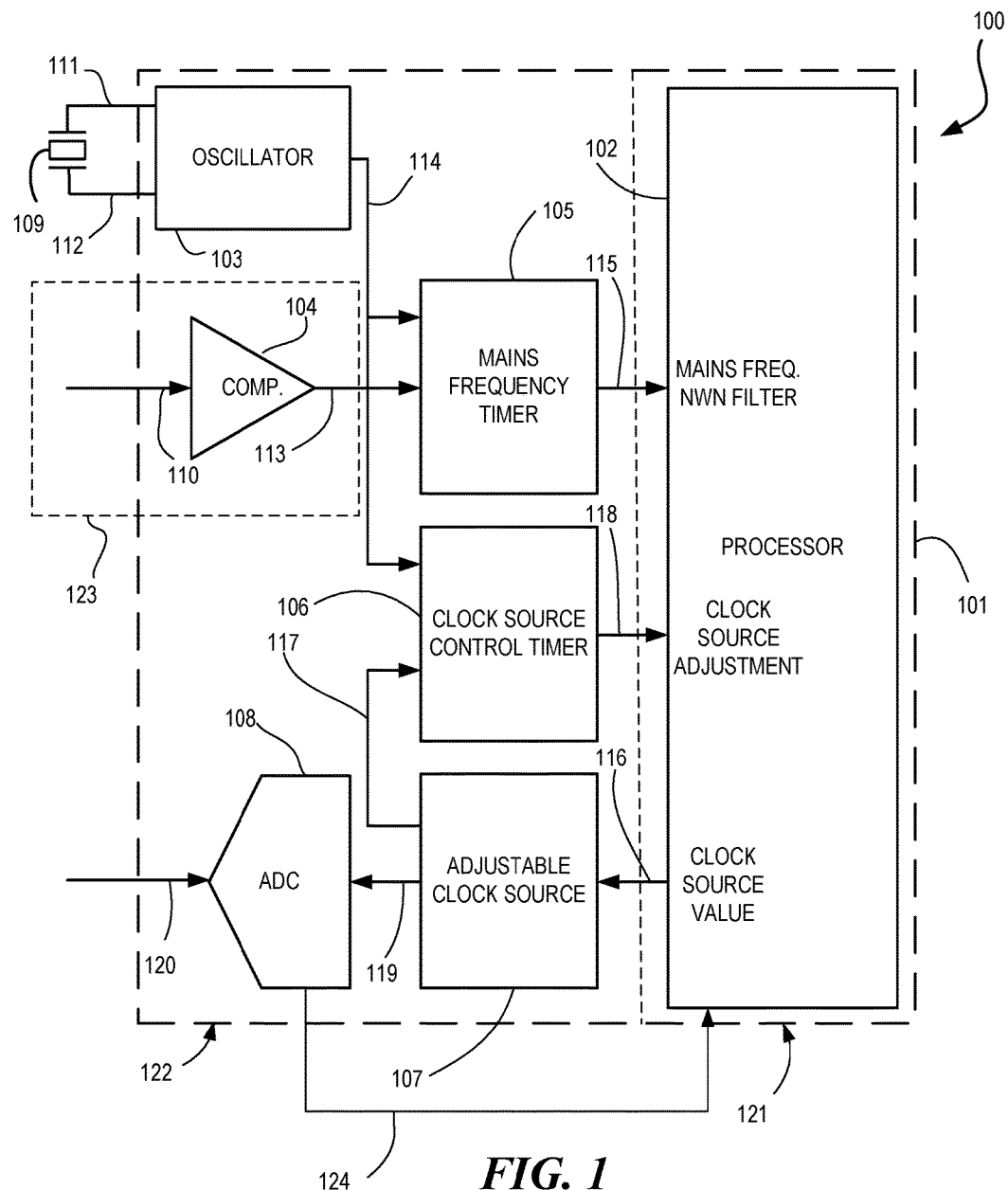
FIG. 1 is a block diagram illustrating an apparatus in accordance with an embodiment.

FIG. 1 is a block diagram illustrating an apparatus in accordance with an embodiment. Apparatus 100 comprises integrated circuit 101 and crystal 109. Integrated circuit 101 comprises control portion 121 and input output (I/O) portion 122. Control portion 121 comprises processor 102. I/O portion 122 comprises oscillator 103, comparator 104, mains frequency timer 105, clock source control timer 106, adjustable clock source 107, and analog to digital converter (ADC) 108.

A first terminal of crystal 109 is connected to a first crystal input 111 of oscillator 103. A second terminal of crystal 109 is connected to a second crystal input 112 of oscillator 103. A mains power line interface 123 is configured to be connected to a mains power line. The mains power line interface 123 comprises comparator 104. An analog signal obtained from a mains power line is provided at input 110 of comparator 104. Comparator 104 compares the mains analog signal to a reference level, such as a zero crossing reference, to determine a relationship of the mains analog signal to the reference level, such as a timing of the mains analog signal crossing a voltage about which its alternating current (AC) waveform is centered. Thus, as an example, comparator 104 can be a zero crossing detector. As another example, comparator 104 can compare the mains analog signal to a level other than a zero level. Comparator 104 provides an output at node 113, which mains frequency timer 105 receives as an input. Oscillator 103, which can be a precise reference oscillator, provides a precise frequency reference signal at node 114 to mains frequency timer 105 and to clock source control timer 106.

Mains frequency timer 105 measures a timing of the output of comparator 104 at node 113 relative to the precise frequency reference signal at node 114 to provide an output signal at node 115 to processor 102 of control portion 121. Clock source control timer 106 measures a timing of the output of adjustable clock source 107 at node 117 relative to the precise frequency reference signal at node 114 to provide an output signal at node 118 to processor 102 of control portion 121.

Processor 102 receives the signal at node 115. Processor 102 performs a non-white noise (NWN) filtering of the signal at node 115. The NWN filtering removes noise that bears a deterministic relationship to a fundamental mains waveform of the mains power line. As an example, switching of nonlinear devices in power supplies powered by the mains power line can introduce noise on the mains power line. The noise can have a fixed relationship to the timing and amplitude of the fundamental mains waveform of the mains power line. For example, the noise can occur at a fixed offset from a zero crossing of the fundamental mains waveform. A NWN filter can filter the mains waveform to remove the noise and, for example, to identify zero crossings of the fundamental mains waveform. From the timing of the zero crossings of the fundamental mains waveform, processor 102 can determine a period of a mains frequency of the fundamental mains waveform.

Processor 102 receives the signal at node 118. Based on the signal at node 118, processor 102 can determine a period of an adjustable clock signal of adjustable clock source 107. Processor 102 compares the period of the adjustable clock signal of adjustable clock source 107 to the period of the mains frequency of the fundamental mains waveform. Based on the comparison, processor 102 provides a clock source value at node 116 to adjustable clock source 107 to adjust the adjustable clock signal of adjustable clock source 107 at node 119 and the output of adjustable clock source 107 at node 117. For example, if the mains frequency has become lower, such that the period of the mains frequency is longer, processor can provide a clock source value at node 116 to adjustable clock source 107 to adjust the adjustable clock signal of adjustable clock source 107 at node 119 to a correspondingly lower frequency such that the number of samples by ADC 108 of the mains waveform per period of the mains frequency remains constant at a desired value. ADC 108 receives the adjustable clock signal at node 119. ADC 108 uses the adjustable clock signal to control the timing of its analog to digital conversion operations. By controlling the timing of its analog to digital conversion operations according to the adjustable clock signal from adjustable clock source 107, ADC 108 can provide a fixed number of samples of an analog input signal, which ADC 108 receives at input 120. ADC 108 can provide the samples, in digital form, to digital logic circuitry, for example, digital logic circuitry in processor 102 via ADC output 124, which is connected from ADC 108 to processor 102.

Figure 2:
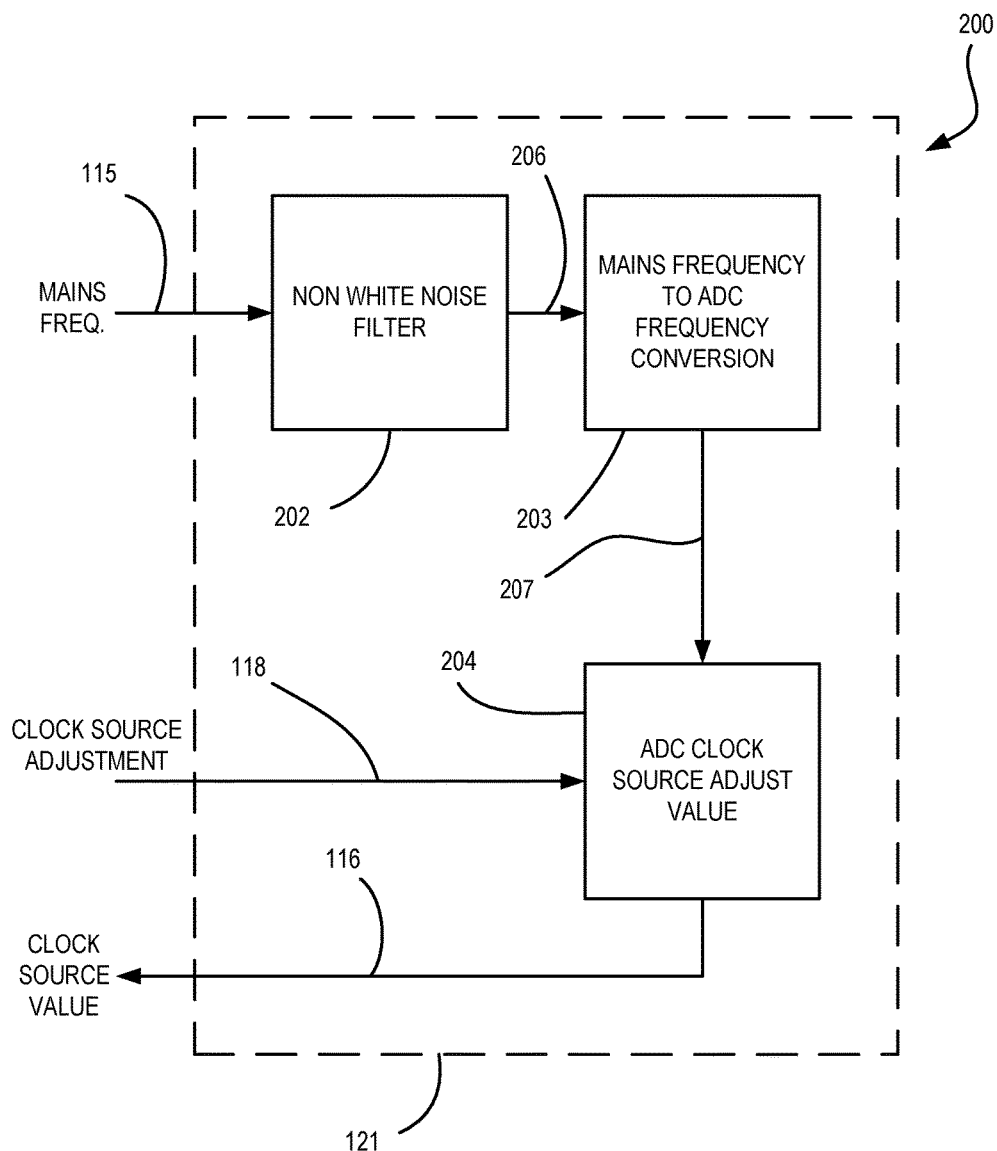
FIG. 2 is a block diagram illustrating a control portion of an apparatus in accordance with an embodiment.

FIG. 2 is a block diagram illustrating a control portion of an apparatus in accordance with an embodiment. Apparatus subsystem 200 comprises control portion 121. Control portion 121 receives a mains frequency signal at node 115. An input of non-white noise (NWN) filter 202 is connected to node 115 and receives the mains frequency signal. NWN filter 202 filters noise, such as non-white noise, from the mains frequency signal to obtain a filtered mains frequency signal at node 206. As any white noise that may be present may typically be of a negligibly low amplitude, the filtered mains frequency signal can unambiguously provide a practically noise-free representation of the mains frequency, for example, a mains frequency very close to 50 Hz or 60 Hz.

Mains frequency to ADC frequency converter 203 receives the filtered mains frequency signal from node 206 at a filtered mains frequency input. Mains frequency to ADC frequency converter 203 determines the mains frequency based on the filtered mains frequency input. For example, the filtered mains frequency input provide timing information of mains waveform zero crossings with any spurious zero crossings resulting from NWN having been disregarded by NWN filter 202. Mains frequency to ADC frequency converter 203 can use the reciprocal of the timing information to determine the mains frequency. Mains frequency to ADC frequency converter 203 determines the mains phase based on the filtered mains frequency input. The mains frequency to ADC frequency converter 203 can use the timing information of the mains waveform zero crossings to determine the mains phase. For example, mains frequency to ADC frequency converter 203 may use a phase locked loop (PLL) to determine the mains phase. Mains frequency to ADC frequency converter 203 determines a desired sampling frequency for the ADC based on the mains frequency. For example, for a desired number of samples per period of the mains frequency, mains frequency to ADC frequency converter 203 can multiply the mains frequency by the desired number of samples per period of the mains frequency to obtain the desired sampling frequency of the ADC, for example, using a PLL to synthesize the desired sampling frequency of the ADC. Mains frequency to ADC frequency converter 203 can determine a desired sampling phase for the ADC based on the mains phase. For example, with the disregarding of spurious zero crossings by the NWN filter 202, valid timing information of valid zero crossings of the mains waveform can be used to align a mains adjustment phase of the mains adjustment signal, which mains frequency to ADC frequency converter 203 provides at node 207, with a mains phase of the mains frequency. Accordingly, ADC sampling can be controlled to occur in alignment with the mains phase of the mains frequency.

ADC clock source adjust value block 204 receives the mains adjustment signal from node 207 and a clock source adjustment signal from node 118. ADC clock source adjustment value block 204 determines a clock source value signal at node 116 based on the mains adjustment signal at node 207 and the clock source adjustment signal from node 118. As an example, if the mains adjustment signal at node 207 indicates a higher frequency or shorter period than a clock frequency or clock period indicated by the clock source adjustment signal from node 118, ADC clock source adjustment value block 204 can provide a clock source value signal at node 116 to increase a clock frequency or shorten a clock period of adjustable clock source 107. As another example, if the mains adjustment signal at node 207 indicates a lower frequency or longer period than a clock frequency or clock period indicated by the clock source adjustment signal from node 118, ADC clock source adjustment value block 204 can provide a clock source value signal at node 116 to decrease a clock frequency or lengthen a clock period of adjustable clock source 107. As a further example, if the mains adjustment signal a node 207 indicates a later phase than a clock phase indicated by the clock source adjustment signal from node 118, ADC clock source adjustment value block 204 can provide a clock source value signal at node 116 to adjust the clock phase of adjustable clock source 107 to be later in time. As yet another example, if the mains adjustment signal at node 207 indicates an earlier phase than a clock phase indicated by the clock source adjustment signal from node 118, ADC clock source adjustment value block 204 can provide a clock source value signal at node 116 to adjust the clock phase of adjustable clock source 107 to be earlier in time.

Figure 3:
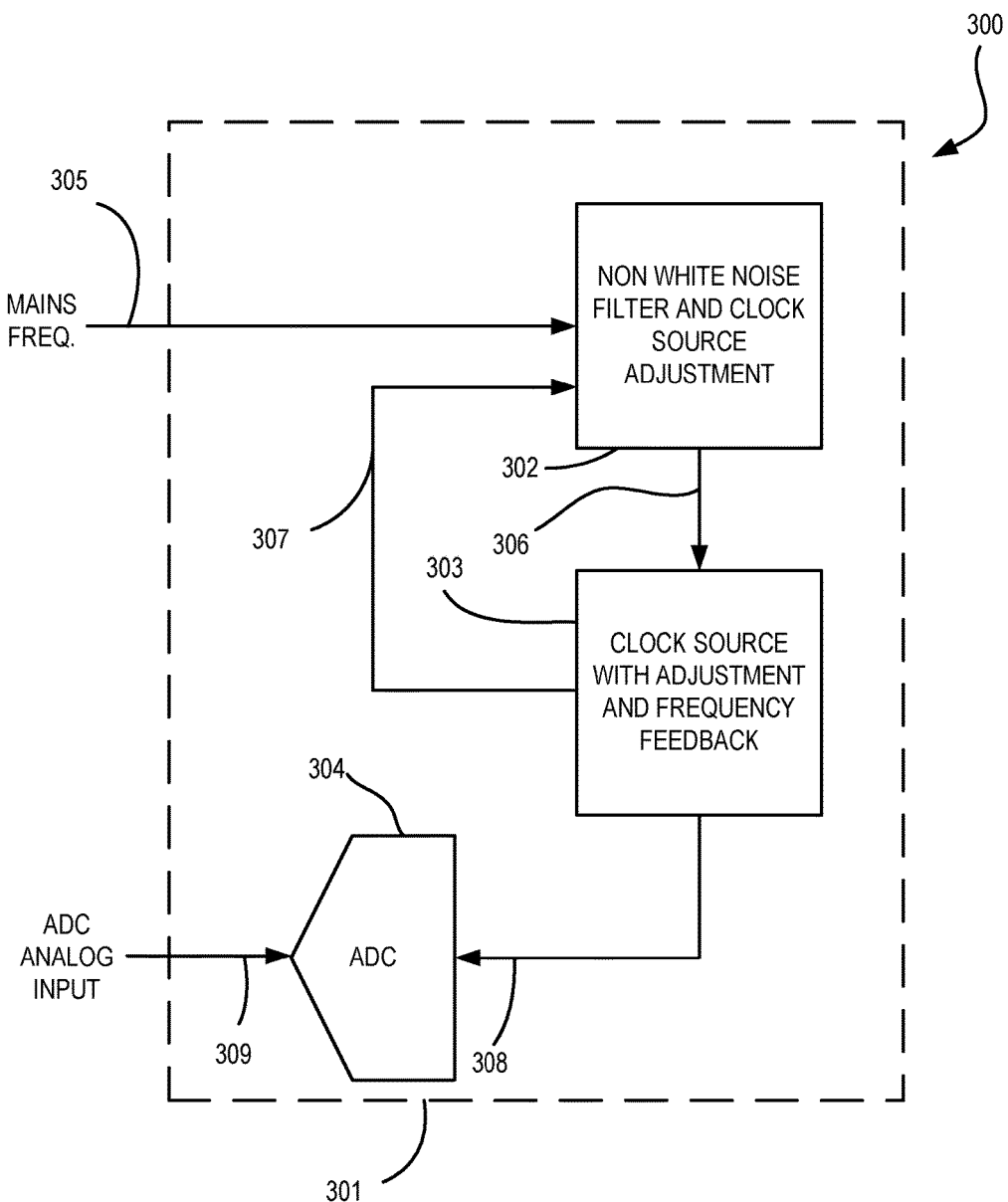
FIG. 3 is a block diagram illustrating an apparatus in accordance with an embodiment.

FIG. 3 is a block diagram illustrating an apparatus in accordance with an embodiment. Apparatus 300 comprises adaptive conversion rate ADC block 301. Adaptive conversion rate ADC block 301 comprises non-white noise (NWN) filter and clock source adjustment block 302, adjustable clock source 303, and ADC 304. As one example, the embodiment of FIG. 3 can be implemented with NWN filter and clock source adjustment block 302 instantiated using clock source control timer 106 and processor 102 of FIG. 1, with clock source 303 with adjustment and frequency feedback 303 instantiated using adjustable clock source 107 of FIG. 1, and with ADC 304 instantiated using ADC 108 of FIG. 1. NWN filter and clock source adjustment block 302 receives a mains frequency signal at node 305. NWN filter and clock source adjustment block 302 performs NWN filtering on the mains frequency signal. NWN filter and clock source adjustment block 302 receives at node 307 a clock source adjustment signal from adjustable clock source 303. The clock source adjustment portion of NWN filter and clock source adjustment block 302 provides a clock source value signal at node 306 based on the NWN filtered mains frequency signal and the clock source adjustment signal. Adjustable clock source 303 receives the clock source value signal at node 306 and provides an adjusted clock signal at node 308 based on the clock source value signal. ADC 304 receives the adjusted clock signal at node 308. ADC 304 uses the adjusted clock signal to control a conversion rate of ADC 304. ADC 304 performs analog to digital conversion of an analog input signal at ADC analog input 309 at a conversion rate based on the adjusted clock signal. Thus, the conversion rate at which ADC 304 performs analog to digital conversion can adapt to changes in a mains frequency of a mains power line.

Figure 4:
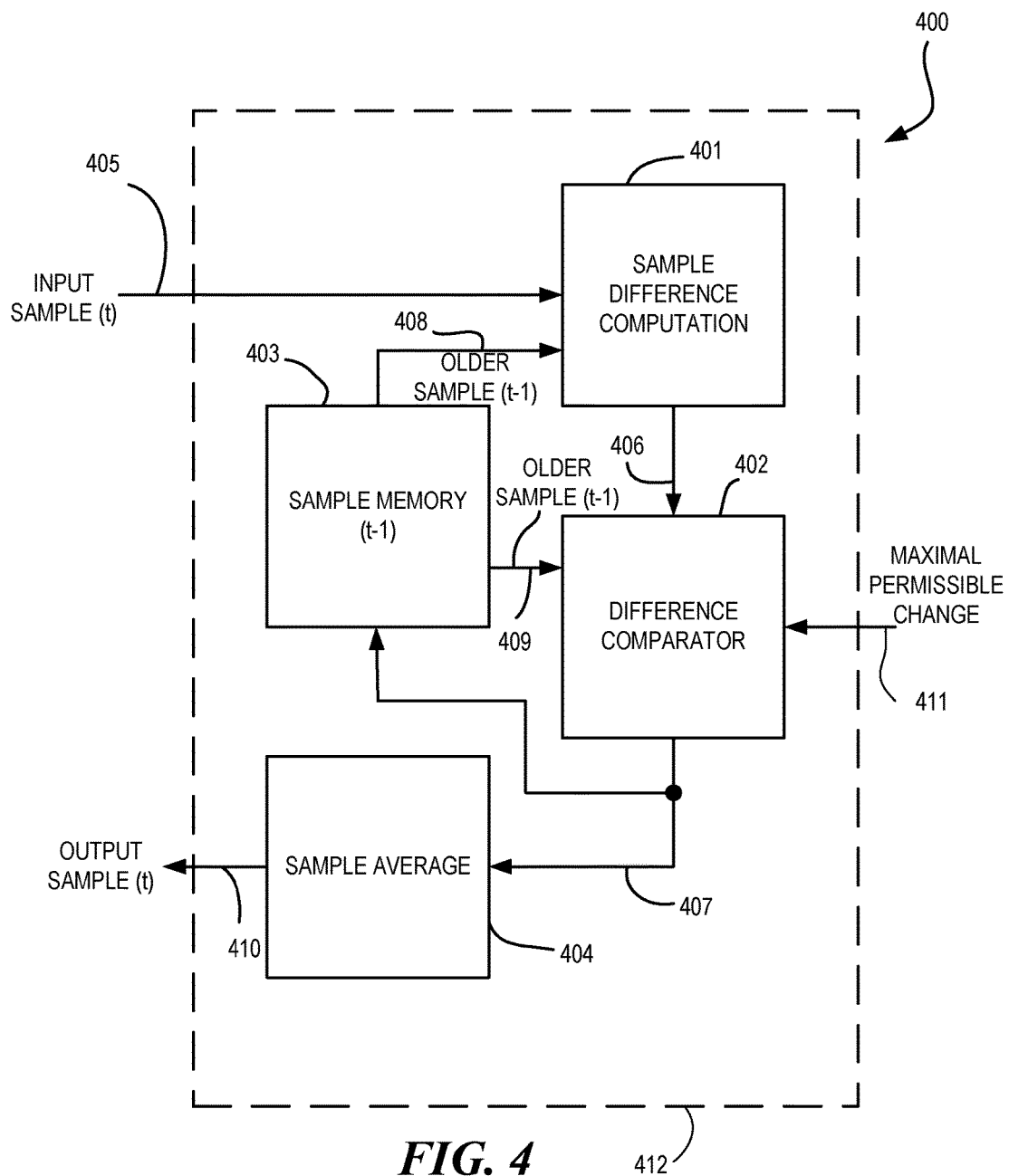
FIG. 4 is a block diagram illustrating a non-white noise (NWN) filter in accordance with an embodiment.

FIG. 4 is a block diagram illustrating a non-white noise (NWN) filter in accordance with an embodiment. NWN filter 400 comprises sample difference computation block 401, difference comparator block 402, sample memory block 403, and sample average block 404. Each input sample for each time t is provided at input 405. Sample difference computation block 401 receives each input sample from input 405. Sample difference computation block 401 also receives an older sample from input 408, obtained from sample memory 403, which can store, for example, an older sample from time (t−1). Sample difference computation engine 401 computes a difference between the input sample for time t and the older sample from time (t−1). Sample difference computation engine 401 provides the difference at output 406.

Difference comparator 402 receives the difference from output 406. Difference comparator 402 receives from sample memory 403 the older sample from time (t−1) at input 409. Difference comparator 402 receives a maximal permissible change value from input 411. Difference comparator 402 provides a clock source correction value at output 407 based on the difference from output 406 and the older sample at input 409, limited by the maximal permissible change value from input 411. Sample memory 403 receives the clock source correction value from output 407 and stores it as an older sample for use in a subsequent iteration. The clock source correction value at output 407 may be used directly as a clock source value to adjust a conversion rate and timing of an ADC, or, as shown in FIG. 4, sample average block 404 can receive the clock source correction value from output 407 and average the value with previous values to provide an averaged clock source correction value at output 410, wherein the averaged clock source correction value may be considered to be an output sample for time t and used as a clock source value to adjust a conversion rate and time of an ADC.

Sample difference computation block 401 subtracts an input sample for time (t) from an older sample (t−1). The sample difference is compared with limit values derived from real physical system behavior. The result of comparison is that the difference is deemed to be within an acceptable range, and therefore accurately representative of a zero crossing of the mains waveform, as opposed to NWN noise, if the difference is less than a maximal permissible change. Conversely, the difference is deemed to be outside of the acceptable range, and therefore considered artifact of NWN noise, if the difference is more than the maximal permissible change. If the difference is less than the maximal permissible change, the NWN filter outputs an output sample (t) equal to the input sample (t). If the difference is more than the maximal permissible change, the NWN filter outputs an output sample (t) equal to a previous input sample (t−1), and the input sample (t) is not stored as a previous input sample (t−1) for future calculations but instead discarded.

Figure 5:
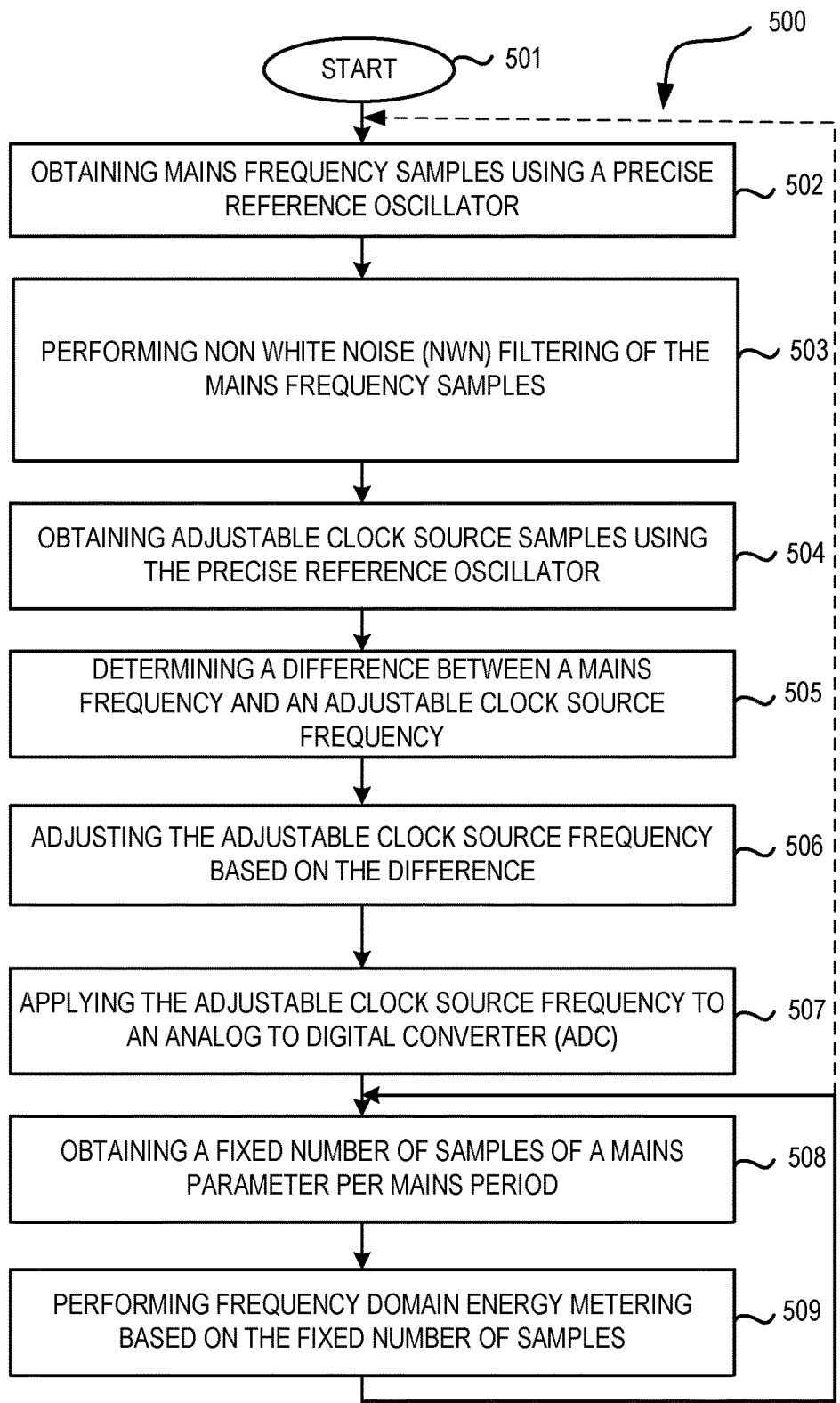
FIG. 5 is a flow diagram illustrating a method in accordance with an embodiment.

FIG. 5 is a flow diagram illustrating a method in accordance with an embodiment. Method 500 begins in block 501 and continues to block 502. In block 502, mains frequency samples are obtained using a precise reference oscillator. From block 502, method 500 continues to block 503. At block 503, non-white noise (NWN) filtering is performed on the mains frequency samples. From block 503, method 500 continues to block 504. At block 504, adjustable clock source samples are obtained using the precise reference oscillator. From block 504, method 500 continues to block 505. At block 505, a difference is determined between a mains frequency and an adjustable clock source frequency. From block 505, method 500 continues to block 506. At block 506, the adjustable clock source frequency is adjusted based on the difference. From block 506, method 500 continues to block 507. At block 507, the adjustable clock source frequency is applied to an analog to digital converter (ADC). From block 507, method 500 continues to block 508. At block 508, a fixed number of samples per mains period is obtained of a mains parameter by the ADC. The fixed number of samples is adjusted according to the adjustable clock source frequency to accommodate any variation of the mains frequency of the mains power line. From block 508, method 500 continues to block 509. At block 509, frequency domain energy metering is performed based on the fixed number of samples. From block 509, method 500 can return to block 508 for additional iterations of obtaining samples. While method 500 need not do so every iteration, method 500 may, from time to time, return to block 502 to perform readjustment of the adjustable clock source frequency according to blocks 502 through 507, allowing the operations of blocks 508 and 509 to benefit from such ongoing readjustment of the adjustable clock source frequency.

At least one embodiment may be used for the adjustment of a clock source based on a mains frequency of a mains power line to maintain a constant number of samples per period of the mains power line even as the mains frequency may vary somewhat over time. The samples taken may be used to measure a mains parameter, such as a mains voltage, a mains current, a mains phase, a mains power factor, a mains power including resistive power and reactive power components, a mains real power including a resistive power component but not a reactive power component, or the like, and combinations thereof. Such measurements may be useful for an energy metering application, for example, for high-precision class meters where cost/performance ratio can be an important attribute. For example, high-precision class energy meters have heretofore required intensive processing to perform ADC conversion in a continuous mode. By providing continuous mode ADC data conversion at an adaptive conversion rate in an efficient manner, at least one embodiment allow implementation using, for example, a low cost microcontroller or, as another example, a higher performance microcontroller, freeing processor cycles to be available for other tasks, such as the analysis and communication of measured data. By maintaining a constant number of samples per period of the mains power line, the sampling and analysis of a mains parameter can be simplified, allowing use of a low cost microcontroller and freeing processor cycles for other tasks.

As the mains frequency is not typically stable with respect to a fixed ADC sampling frequency, the adaptive approach of using an adjustable clock source controlled by a NWN filtered mains frequency effectively links the ADC sampling frequency to the mains frequency, compensating for any drift of the mains frequency over time. A fixed ratio can be maintained between the mains frequency and the adjustable clock source frequency. However, various electrical noises can be present on a mains power line. If the noise is of sufficient amplitude or alters the mains waveform significantly (e.g., introduces additional zero crossings), detection of the mains frequency can be difficult. An example of such noise is "synchronous noise" generated by the rectifiers and active switching devices typically found in switch mode power supplies (SMPS) and power factor correction (PFC) circuits. Such "synchronous noise" need not have the stochastic properties of, for example, Gaussian (e.g., white) noise, but can be somewhat deterministically related to the mains frequency. Such noise can be hard to remove using standard filters as the noise frequency is close to the mains frequency to which the "synchronous noise" is related.

By adjusting the ADC sampling rate to follow the mains frequency to obtain a fixed number of samples and adding the stochastic filter in the circuit topology, synchronous noise can be effectively mitigated to allow accurate and reliable measurement of mains frequency and adjustment of the ADC sampling rate accordingly. At least one embodiment can ensure a fixed number of samples within an energy measurement period that may vary over time, can minimize microcontroller unit (MCU) load, as additional zero crossings of a mains waveform that could complicate time to frequency conversion can be filtered out, can avoid a need for an interpolation intermediate re-calculation step, can remove a need for ADC retriggering, and can provide combinations thereof. By avoiding a need to interrupt ADC measurement, a continuous scan ADC with output filters, such as a sigma delta ADC, can operate continuously. The use of a NWN filter can increase robustness of mains frequency determination, which can improve reliability of sampling a mains parameter at a conversion rate based on the mains frequency.

An energy metering system uses an analog front end (AFE) circuit to connect to the power distribution network or powered apparatus being monitored. By obtaining a fixed number of ADC samples per period regardless of changes in the duration of the period, an adaptive sampling AFE of an energy metering system, the AFE can provide coherent ADC operation with respect to the main signal frequency. The ability to provide continuous control of the adjustable clock source to provide a conversion clock for the ADC is suitable for an ADC configured to perform continuous conversions in a continuous conversion mode. Standard inexpensive parts, such as an inexpensive microcontroller, can be used, and, for an adjustable clock source, a low-cost, on-chip clock source, such as an internal resistor-capacitor (IRC) oscillator can be used, with the techniques disclosed herein able to compensate for any clock source drift as well as mains frequency drift.

At least one embodiment can avoid several difficulties that could otherwise arise. As an example, the NWN filter can prevent synchronous noise from causing sampling error, as might occur without the NWN filter. As another example, the ability to determine an adjustment for an adjustable clock source and adjust the clock source to adjust the conversion rate of an ADC even while the ADC is continuously performing conversions in a continuous conversion mode avoids a decreased sampling rate and precision that could otherwise occur. As a further example, by maintaining a fixed relationship between a mains frequency and an ADC conversion rate, the need for complicated signal processing operations, such as oversampling and interpolation, which can result in an increased processor load and fewer usable samples, can be avoided. Instead, at least one embodiment can provide a desired level of precision while decreasing the processor load by approximately 40 percent.

At least one embodiment can be applied to the metering of electricity in a variety of electric power meters, including one phase, two phase, and three phase electric power meters. Such power meters can use a time domain approach to metering and to conversion clock adjustment.

A non-white noise (NWN) filter is digital filter designed for signals with non Gaussian (e.g., white) noise distribution. A typical scenario where a system is affected by non-white noise is system with interruptions occurring in relation to a mains waveform or a system function changing according to a relationship with the mains waveform. For example, the switching of a load can introduce not only the change in amplitude from the increased or reduced current of adding or removing the load but also additional influences, such as back electromotive force (back EMF) resulting from the switching of inductive loads. When that switching is performed based on a mains waveform, for example, in relation to a zero crossing of mains waveform, the noise generated correspondingly can bear a relationship to the mains waveform. Such noise is characterized as non-white noise, as the pollution it adds to the power distribution system is out of the Gaussian curve. By, for example, processing time domain samples based on the mains waveform, a NWN filter can obtain information about the mains waveform that can be used to meaningfully characterize the mains waveform in the time domain or in the frequency domain with the NWN effectively removed.

A NWN filter is based on a statistical principle. Each real physical system has a finite time constant. So a system state change takes some amount of real time. For example, the rate of change of the mains frequency of a power distribution network is constrained such that the amount of time needed for the mains frequency to change from one frequency to another is based on the difference of the starting and ending frequencies. The physical system behavior can be used to derive the maximal possible rates of change. If the power distribution network frequency is observed to change more than a maximal possible rate of change, the observed change value is presumed to be wrong, and it is concluded that the measurement was affected by a NWN event.

In the event that zero crossings arising from NWN are used as a basis of determining a mains phase of a mains period of a mains waveform instead of the zero crossings of the underlying mains waveform itself, a constant number of samples per mains period can still be obtained. Moreover, phase alignment with the underlying mains waveform itself can be performed in a processor, such as processor 102, for example, by reference to other information, such as amplitude information about the mains waveform, for example, ADC sample values obtained using ADC 108. As another example, as the phase of the underlying mains waveform itself can be expected to be more stable over time than NWN that may be present, the NWN can be expected to settle on the underlying mains phase of the underlying mains waveform over time even in the presence of noise, such as NWN.

In accordance with at least one embodiment, a method comprises obtaining mains samples of a mains power line signal, performing non-white noise (NWN) filtering of the mains power line signal, obtaining adjustable clock source samples of an adjustable clock signal of an adjustable clock oscillator, determining a difference based on the mains samples and the adjustable clock source samples, adjusting an adjustable clock source frequency of the adjustable clock oscillator based on the difference, and applying the adjustable clock source frequency to an analog to digital converter (ADC) to determine a conversion rate of the ADC. In accordance with at least one embodiment, the method further comprises obtaining a fixed number of mains samples of a mains parameter per mains period and performing frequency domain energy metering based on the fixed number of samples. In accordance with at least one embodiment, the mains samples are time domain mains samples and the adjustable clock source samples are time domain adjustable clock source samples. In accordance with at least one embodiment, the mains samples are obtained based on detection of zero crossings of a mains waveform. In accordance with at least one embodiment, the NWN filtering comprises performing a comparison to a maximal permissible change value. In accordance with at least one embodiment, the maximal permissible change value provides qualification limited to a maximal mains frequency change per unit time. In accordance with at least one embodiment, the adjustable clock oscillator is an internal resistor capacitor (IRC) timer of a microcontroller unit (MCU).

In accordance with at least one embodiment, an apparatus comprises a control portion for performing non-white noise filtering and for providing a clock source value signal based on a mains frequency signal and a clock source adjustment signal, a mains frequency timer coupled to the control portion for providing the mains frequency signal based on a mains waveform comparison signal, a clock source control timer coupled to the control portion for providing the clock source adjustment signal based on an adjustable clock signal, an adjustable clock oscillator for providing the adjustable clock signal and adjusting the adjustable clock signal based on the clock source value signal, and an analog to digital converter (ADC) coupled to the adjustable clock oscillator for performing analog to digital conversions at a conversion rate based on the adjustable clock signal. In accordance with at least one embodiment, the apparatus obtains a fixed number of samples of a mains parameter per mains period and performs frequency domain energy metering based on the fixed number of samples. In accordance with at least one embodiment, the mains samples are time domain mains samples and the adjustable clock source samples are time domain adjustable clock source samples. In accordance with at least one embodiment, the mains samples are obtained based on detection of zero crossings of a mains waveform. In accordance with at least one embodiment, the control portion performs a comparison to a maximal permissible change value. In accordance with at least one embodiment, the maximal permissible change value provides qualification limited to a maximal mains frequency change per unit time. In accordance with at least one embodiment, the adjustable clock oscillator is an internal resistor capacitor (IRC) timer of a microcontroller unit (MCU).

In accordance with at least one embodiment, an energy metering system comprises a control portion for performing non-white noise filtering and for providing a clock source value signal based on a mains frequency signal and a clock source adjustment signal, a mains power line interface portion configured to be coupled to a mains power line for providing a mains waveform comparison signal, a mains frequency timer coupled to the control portion for providing the mains frequency signal based on a mains waveform comparison signal, a clock source control timer coupled to the control portion for providing the clock source adjustment signal based on an adjustable clock signal, an adjustable clock oscillator for providing the adjustable clock signal and adjusting the adjustable clock signal based on the clock source value signal, and an analog to digital converter (ADC) coupled to the adjustable clock oscillator for performing analog to digital conversions at a conversion rate based on the adjustable clock signal. In accordance with at least one embodiment, the energy metering system obtains a fixed number of samples of a mains parameter per mains period and performs frequency domain energy metering based on the fixed number of samples. In accordance with at least one embodiment, the mains samples are time domain mains samples and the adjustable clock source samples are time domain adjustable clock source samples. In accordance with at least one embodiment, the mains samples are obtained based on detection of zero crossings of a mains waveform. In accordance with at least one embodiment, the control portion performs a comparison to a maximal permissible change value. In accordance with at least one embodiment, the maximal permissible change value provides qualification limited to a maximal mains frequency change per unit time.

In the foregoing description, the term "at least one of" is used to indicate one or more of a list of elements exists, and, where a single element is listed, the absence of the term "at least one of" does not indicate that it is the "only" such element, unless explicitly stated by inclusion of the word "only" or a similar qualifier.

The concepts of the present disclosure have been described above with reference to specific embodiments. However, one of ordinary skill in the art will appreciate that various modifications and changes can be made without departing from the scope of the present disclosure as set forth in the claims below. In particular, the particular types of circuits used to implement apparatus may be varied according to different embodiments. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
   obtaining mains samples of a mains power line signal;
   performing non-white noise (NWN) filtering of the mains power line signal;
   obtaining adjustable clock source samples of an adjustable clock signal of an adjustable clock oscillator;
   determining a difference based on the mains samples and the adjustable clock source samples;
   adjusting an adjustable clock source frequency of the adjustable clock oscillator based on the difference; and
   applying the adjustable clock source frequency to an analog to digital converter (ADC) to determine a conversion rate of the ADC.

2. The method of claim 1 further comprising:
   obtaining a fixed number of mains samples of a mains parameter per mains period; and
   performing frequency domain energy metering based on the fixed number of samples.

3. The method of claim 2 wherein the mains samples are time domain mains samples and the adjustable clock source samples are time domain adjustable clock source samples.

4. The method of claim 3 wherein the mains samples are obtained based on detection of zero crossings of a mains waveform.

5. The method of claim 1 wherein the performing the NWN filtering comprises:
   performing a comparison to a maximal permissible change value.

6. The method of claim 5 wherein the maximal permissible change value provides qualification limited to a maximal mains frequency change per unit time.

7. The method of claim 1 wherein the adjustable clock oscillator is an internal resistor capacitor (IRC) timer of a microcontroller unit (MCU).

8. Apparatus comprising:
a control portion for performing non-white noise filtering and for providing a clock source value signal based on a mains frequency signal and a clock source adjustment signal;
a mains frequency timer coupled to the control portion for providing the mains frequency signal based on a mains waveform comparison signal;
a clock source control timer coupled to the control portion for providing the clock source adjustment signal based on an adjustable clock signal;
an adjustable clock oscillator for providing the adjustable clock signal and adjusting the adjustable clock signal based on the clock source value signal; and
an analog to digital converter (ADC) coupled to the adjustable clock oscillator for performing analog to digital conversions at a conversion rate based on the adjustable clock signal.

9. The apparatus of claim 8 wherein the apparatus obtains a fixed number of samples of a mains parameter per mains period and performs frequency domain energy metering based on the fixed number of samples.

10. The apparatus of claim 9 wherein the mains samples are time domain mains samples and the adjustable clock source samples are time domain adjustable clock source samples.

11. The apparatus of claim 10 wherein the mains samples are obtained based on detection of zero crossings of a mains waveform.

12. The apparatus of claim 8 wherein the control portion performs a comparison to a maximal permissible change value.

13. The apparatus of claim 12 wherein the maximal permissible change value provides qualification limited to a maximal mains frequency change per unit time.

14. The apparatus of claim 8 wherein the adjustable clock oscillator is an internal resistor capacitor (IRC) timer of a microcontroller unit (MCU).

15. An energy metering system comprising:
a control portion for performing non-white noise filtering and for providing a clock source value signal based on a mains frequency signal and a clock source adjustment signal;
a mains power line interface portion configured to be coupled to a mains power line for providing a mains waveform comparison signal;
a mains frequency timer coupled to the control portion for providing the mains frequency signal based on a mains waveform comparison signal;
a clock source control timer coupled to the control portion for providing the clock source adjustment signal based on an adjustable clock signal;
an adjustable clock oscillator for providing the adjustable clock signal and adjusting the adjustable clock signal based on the clock source value signal; and
an analog to digital converter (ADC) coupled to the adjustable clock oscillator for performing analog to digital conversions at a conversion rate based on the adjustable clock signal.

16. The energy metering system of claim 15 wherein the energy metering system obtains a fixed number of samples of a mains parameter per mains period and performs frequency domain energy metering based on the fixed number of samples.

17. The energy metering system of claim 15 wherein the mains samples are time domain mains samples and the adjustable clock source samples are time domain adjustable clock source samples.

18. The energy metering system of claim 15 wherein the mains samples are obtained based on detection of zero crossings of a mains waveform.

19. The energy metering system of claim 15 wherein the control portion performs a comparison to a maximal permissible change value.

20. The energy metering system of claim 15 wherein the maximal permissible change value provides qualification limited to a maximal mains frequency change per unit time.

* * * * *